(12) United States Patent
Banerjee et al.

(10) Patent No.: US 10,796,761 B2
(45) Date of Patent: *Oct. 6, 2020

(54) TAILORING CURRENT MAGNITUDE AND DURATION DURING A PROGRAMMING PULSE FOR A MEMORY DEVICE

(71) Applicant: Intel Corporation, Santa Clara, CA (US)

(72) Inventors: Koushik Banerjee, Milpitas, CA (US); Lu Liu, Boise, ID (US); Sanjay Rangan, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/520,213

(22) Filed: Jul. 23, 2019

(65) Prior Publication Data

US 2019/0348114 A1 Nov. 14, 2019

Related U.S. Application Data

(63) Continuation of application No. 15/942,329, filed on Mar. 30, 2018, now Pat. No. 10,360,977.

(51) Int. Cl.
*G11C 16/04* (2006.01)
*G11C 13/00* (2006.01)

(52) U.S. Cl.
CPC ...... *G11C 13/0069* (2013.01); *G11C 13/0004* (2013.01); *G11C 13/0026* (2013.01); *G11C 13/0028* (2013.01); *G11C 13/0035* (2013.01); *G11C 13/004* (2013.01); *G11C 2013/005* (2013.01); *G11C 2013/0078* (2013.01); *G11C 2013/0092* (2013.01); *G11C 2213/15* (2013.01); *G11C 2213/71* (2013.01)

(58) Field of Classification Search
CPC ........ G11C 11/5628; G11C 8/10; G11C 16/10
See application file for complete search history.

(56) References Cited

U.S. PATENT DOCUMENTS 10,360,977 B2 * 7/2019 Banerjee ............ G11C 13/0004
2006/0221660 A1 10/2006 Hemink et al.
(Continued)

OTHER PUBLICATIONS

European Search Report dated Jul. 18, 2019, in EP Application No. 19157046.4 51 Pages.

*Primary Examiner* — Tuan T Nguyen
(74) *Attorney, Agent, or Firm* — Alliance IP, LLC

(57) ABSTRACT

Technology for a memory device is described. The memory device can include an array of memory cells and a memory controller. The memory controller can receive a request to program a memory cell within the array of memory cells. The memory controller can select a current magnitude and a duration of the current magnitude for a programming set pulse based on a polarity of access for the memory cell, a number of prior write cycles for the memory cell, and electrical distances between the memory cell and wordline/bitline decoders within the array of memory cells. The memory controller can initiate, in response to the request, the programming set pulse to program the memory cell within the array of memory cells. The selected current magnitude and the selected duration of the current magnitude can be applied during the programming set pulse.

26 Claims, 10 Drawing Sheets

(56) References Cited

U.S. PATENT DOCUMENTS

| | | | |
|---|---|---|---|
| 2008/0158979 A1* | 7/2008 | Kamei | G11C 16/0483 365/185.19 |
| 2008/0158980 A1* | 7/2008 | Kamei | G11C 16/10 365/185.19 |
| 2008/0198660 A1* | 8/2008 | Mokhlesi | G11C 11/5628 365/185.19 |
| 2013/0051120 A1 | 2/2013 | Young-Hoon et al. | |
| 2017/0229172 A1 | 8/2017 | Zeng et al. | |
| 2019/0043585 A1 | 2/2019 | Banerjee et al. | |

* cited by examiner

TAILORING CURRENT MAGNITUDE AND DURATION DURING A PROGRAMMING PULSE FOR A MEMORY DEVICE

PRIORITY DATA

This application is a Continuation of U.S. patent application Ser. No. 15/942,329, filed Mar. 30, 2018, now issued as U.S. Pat. No. 10,360,977, which is incorporated herein by reference in its entirety.

BACKGROUND

Memory devices are typically provided as internal, semiconductor, integrated circuits in computers or other electronic devices. There are many different types of memory including volatile memory, for example, dynamic random access memory (DRAM), synchronous dynamic random access memory (SDRAM), and non-volatile memory, for example, flash memory Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others.

BRIEF DESCRIPTION OF THE DRAWINGS

Features and advantages of technology embodiments will be apparent from the detailed description which follows, taken in conjunction with the accompanying drawings, which together illustrate, by way of example, various technology features; and, wherein.

Figure 1A:
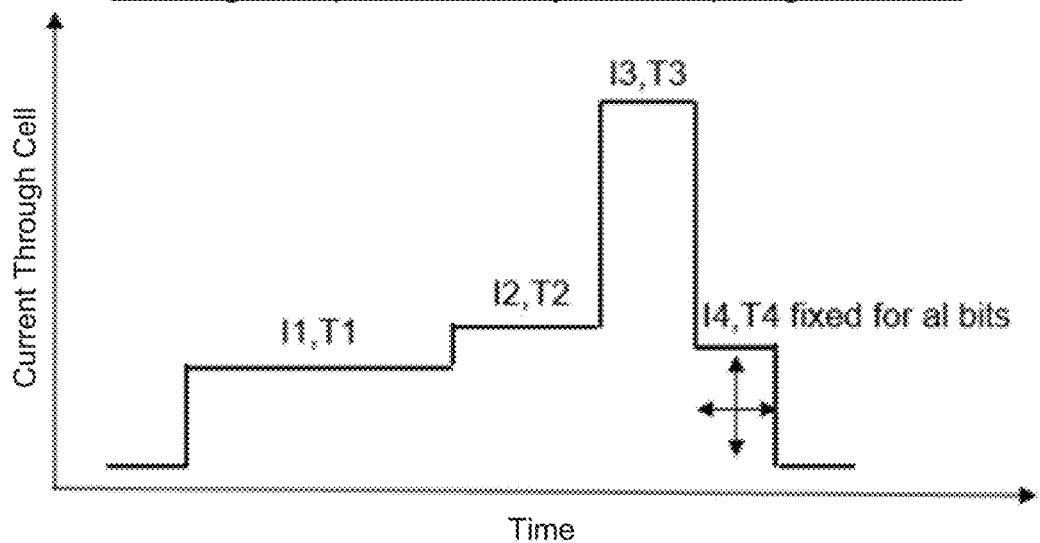
FIG. 1A illustrates a traditional multi-stage programming set procedure for a memory stack that includes a select device (SD) and programmable memory (PM) in accordance with an example embodiment.

Reference will now be made to the exemplary embodiments illustrated, and specific language will be used herein to describe the same. It will nevertheless be understood that no limitation on technology scope is thereby intended.

DESCRIPTION OF EMBODIMENTS

Before the disclosed technology embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall technological concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," "maximized," "minimized," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

A memory device or memory system can utilize non-volatile memory (NVM). NVM is a storage medium that does not require power to maintain the state of data stored by the medium. NVM has traditionally been used for the task of data storage, or long-term persistent storage, but new and evolving memory technologies allow the use of NVM in roles that extend beyond traditional data storage. One example of such a role is the use of NVM as main or system memory. Non-volatile system memory (NVMsys) can combine data reliability of traditional storage with ultra-low latency and high bandwidth performance, having many advantages over traditional volatile memory, such as high density, large capacity, lower power consumption, and reduced manufacturing complexity, to name a few. Byte-addressable, write-in-place NVM such as three-dimensional (3D) cross-point memory, for example, can operate as byte-addressable memory similar to dynamic random-access memory (DRAM), or as block-addressable memory similar to NAND flash. In other words, such NVM can operate as system memory or as persistent storage memory (NVMstor). In some situations where NVM is functioning as system memory, stored data can be discarded or otherwise rendered unreadable when power to the NVMsys is interrupted. NVMsys also allows increased flexibility in data management by providing non-volatile, low-latency memory that can be located closer to a processor in a computing device. In some examples, NVMsys can reside on a DRAM bus, such that the NVMsys can provide ultra-fast DRAM-like access to data. NVMsys can also be useful in computing environments that frequently access large, complex data sets, and environments that are sensitive to downtime caused by power failures or system crashes.

Non-limiting examples of NVM can include planar or three-dimensional (3D) NAND flash memory, including single or multi-threshold-level NAND flash memory, NOR flash memory, single or multi-level Phase Change Memory (PCM), such as chalcogenide glass PCM, planar or 3D PCM, cross-point array memory, including 3D cross-point memory, non-volatile dual in-line memory module (NVDIMM)-based memory, such as flash-based (NVDIMM-F) memory, flash/DRAM-based (NVDIMM-N) memory, persistent memory-based (NVDIMM-P) memory, 3D cross-point-based NVDIMM memory, resistive RAM (ReRAM), including metal-oxide- or oxygen vacancy-based ReRAM, such as $HfO_2$-, $Hf/HfO_x$-, $Ti/HfO_2$-, $TiO_x$-, and $TaO_x$-based ReRAM, filament-based ReRAM, such as $Ag/GeS_2$-, $ZrTe/Al_2O_3$-, and Ag-based ReRAM, programmable metallization cell (PMC) memory, such as conductive-bridging RAM (CBRAM), silicon-oxide-nitride-oxide-silicon (SONOS) memory, ferroelectric RAM (FeRAM), ferroelectric transistor RAM (Fe-TRAM), anti-ferroelectric memory, polymer memory (e.g., ferroelectric polymer memory), magnetoresistive RAM (MRAM), write-in-place non-volatile MRAM (NVMRAM), spin-transfer torque (STT) memory, spin-orbit torque (SOT) memory, nanowire memory, electrically erasable programmable read-only memory (EEPROM), nanotube RAM (NRAM), other memristor- and thyristor-based memory, spintronic magnetic junction-based memory, magnetic tunneling junction (MTJ)-based memory, domain wall (DW)-based memory, and the like, including combinations thereof.

The term "memory device" can refer to the die itself and/or to a packaged memory product. NVM can be byte or block addressable. In some examples, NVM can comply with one or more standards promulgated by the Joint Electron Device Engineering Council (JEDEC), such as JESD21-C, JESD218, JESD219, JESD220-1, JESD223B, JESD223-1, or other suitable standard (the JEDEC standards cited herein are available at www.jedec.org). In one specific example, the NVM can be 3D cross-point memory. In another specific example, the memory can be NAND or 3D NAND memory. In another specific example, the system memory can be STT memory.

In one configuration, a technology is described for tailoring a current magnitude and a duration of the current magnitude during a programming set procedure for programming a memory cell based on a polarity of access of the memory cell, a number of prior write cycles for the memory cell, and a decoder distance (e.g., electrical distances between the memory cell and wordline/bitline decoders within an array of memory cells). In one example, the current magnitude and the duration can be tailored for a low-current termination step in a multi-stage programming set procedure for phase change memory based on the polarity of access, the number of prior write cycles, and the decoder distance. In an alternative example, the current magnitude and the duration can be tailored for a square programming set procedure for single amorphous chalcogenide memory based on the polarity of access, the number of prior write cycles, and the decoder distance.

In one example, the programming set procedure can involve applying a program pulse to a memory stack. The memory stack can include a programmable memory (PM) and a select (i.e. selecting) device (SD). Generally speaking, in a memory array, one particular memory cell in the memory array can be accessed at a given time. In a 3D memory structure, there can be multiple wordlines and multiple bitlines that are crossing each other. To decode a memory cell with a position of (X, Y) can involve applying a particular bias. For example, on the wordline side, X=100, and on the bitline side, Y=100. In this case, only the memory cell having a position of (100, 100) can receive the full bias, while other memory cells (e.g., a memory cell having a position of (100, 0), a memory cell having a position of (100, 1, and so on) that are not selected but are on the same wordline or bitline can receive approximately half of the bias. It is desirable to have memory cells that can turn to an ON state with the full bias, but stay in an OFF state with the half bias, such that only desired memory cells are selected. To achieve this, the SD can be positioned between the wordline and the PM. For example, for a given wordline, the SD can be positioned on top of the wordline, and the PM can be positioned on top of the SD, where a given bitline can be positioned on top of the PM. The bitline and the wordline can be in perpendicular directions. Current can flow to both the PM and the SD. The function of the SD is that when a particular memory cell is to not be selected, the SD can cause the PM to receive almost no current. In other words, the SD can act as a barrier. Until current is received from both the wordline and the bitline, the SD can prevent the particular memory cell from having a read or write event. Thus, the particular memory cell can only be selected when a full bias is applied. In other words, in response to receiving the full bias, the particular memory cell can transition from the OFF state to the ON state.

In one example, the SD can provide other effects as well. For example, while a programming window for a memory cell is generally from the PM, the SD can contribute to the programming window as well. For example, the PM can contribute approximately 80% of the programming window and the SD can contribute approximately 20% of the programming window.

In previous solutions, the programming set procedure has been optimized for the PM, with the assumption that the SD has no response to a programming electrical pulse. However, the SD can show memory effect/retention characteristics that are sensitive to the electrical pulse shape, current and/or duration, and can vary depending on the polarity of access, the number of prior write cycles and the distance from wordline/bitline decoders within the array of memory cells.

Generally speaking, the SD can be used to selectively turn on a target cell and the PM can be used to build a voltage window between a set and reset state. However, the SD in actuality can show a non-constant voltage threshold (Vt) with set or reset programming. The SD memory effect or retention characteristics can be defined as a delta Vt between the set and reset state from the SD, and can cause sensitivity to the electrical pulse shape, current and/or duration, and can vary depending on the polarity of access, the number of prior write cycles and the distance from wordline/bitline decoders within the array of memory cells. A positive memory effect can add to a PM programming window, and can increase a total delta Vt between the set and reset state.

In the previous solutions, the programming electrical pulse during the programming set procedure did not place the SD in an energetically favorable state, thereby contributing to an increased amount of error and a reduced life of the memory. For example, in the previous solutions, a multi-stage programming set procedure would end with a fixed low current stage to ensure PM crystallization setback, or a current magnitude/duration during the multi-stage programming set procedure would be adjusted to only compensate for the decoder distance. Thus, the previous solutions did not involve optimizing the current magnitude/duration for the SD, which has been now shown to possess memory effect/retention characteristics that are sensitive to the polarity of access and the number of prior write cycles.

In the present technology, rather than implementing a fixed current magnitude (I4) and a fixed duration (T4) during a multi-stage programming set procedure for phase change memory (or a square programming set procedure for single amorphous chalcogenide memory) or only compensating for the decoder distance, as in previous solutions, the current magnitude (I4) and duration (T4) can be adjusted or tailored based on a polarity of access (or polarity deck) (as an optimal current magnitude/duration can vary with the polarity of access) and the current magnitude (I4) can be adjusted or tailored based on the number of prior write cycles (as the SD material composition can change over time with cycling stress).

In one example, scalable 3D memory arrays can use the SD and the PM in the same memory stack. So far, electrical pulses have been optimized for the PM only and not for the SD. Thus, optimizing the current magnitude (I4) and duration (T4) to expand the SD memory effect and optimize the SD retention from an initial time (e.g., time 0) through a cycling endurance can improve an overall read window of the memory stack. Similarly, the current magnitude (I4) and duration (T4) can be optimized for scalable 3D memory arrays that employ single amorphous chalcogenide memory.

In one configuration, rather than implementing a fixed current magnitude/duration (I4/T4) for a multi-stage programming set procedure (or a square programming set procedure for single amorphous chalcogenide memory), the current magnitude/duration (I4/T4) can be tailored or adjusted based on three factors: the polarity of access (or polarity deck), the number of prior write cycles, and the decoder distance. For example, first, the current magnitude/duration (I4/T4) can be tailored based on the polarity/deck. An optimal current magnitude/duration (I4/T4) for a desirable SD memory effect/drift can vary depending on the polarity of access as SD segregation can be opposite depending on the polarity of access. Second, the current magnitude (I4) can be tailored based on the number of prior write cycles, as the SD material composition/segregation can change over time due to cycling stress. Third, the current magnitude (I4) can be tailored based on the electrical distance from the decoders. For example, an optimal current magnitude (I4) can be lower for a larger electrical distance (or far electrical distance), whereas the current magnitude (I4) can be higher for a smaller electrical distance (or near electrical distance), and can be a function of a SD holding requirement and array parasitic resistance/capacitance resulting in a best possible memory effect for all electrical distances.

Generally speaking, the SD can be composed of multiple elements. The SD segregation indicates the notion that elements will gradually migrate into different directions depending on the electronegativity, current direction, current amplitude and time. This effect can change a local composition of the SD as a function of prior write cycles. In addition, the SD holding requirement and array parasitic resistance/capacitance indicates the notion that a write or read access of the memory cell necessitates the SD to be turned into a stable on-state for the operation time. The stable on-state necessitates the programming current to be above a threshold value to avoid turning off the SD or circuit oscillation. The threshold value can be determined based on SD characteristics, as well as an external RC, i.e., the resistance and capacitance in the array.

In one configuration, the current magnitude (I4) and the duration (T4) can be modified based on various input parameters, such as the polarity of access, the number of write cycles and the distance from the decoder within an array of memory cells for the SD. Depending on the input parameters (which can be based on the specific properties of a particular device), the current magnitude (I4) and the duration (T4) can be optimized to decrease error and increase life of the memory. Thus, the input parameters are not static for all devices, but rather can be dynamically adjustable depending on specific properties of a particular device.

In one example, generally speaking, a two-dimensional array of memory cells can include a bitline on a positive side and a wordline on a negative side (or inactive side), or alternatively, a bitline on the negative side and the wordline on the positive side, depending on the design of the two-dimensional array. In a stack array structure, different stacks can have different designs. For example, a two-array structure can share one bitline, where an upper level and a lower level can have a different polarity when driving a positive voltage on the bitline. In this case, the wordline can be negative for both levels. The upper level can consist of a wordline, a PM, an SD and a bitline, whereas the lower level can consist of a bitline, a PM, an SD and a wordline. The different stacks can be reversed or mirror images of each other. Since the polarity can change the SD properties, the polarity of access of a memory cell that is being programmed can be accounted for when selecting the current magnitude and duration (I4, T4) during the programming set procedure. In other words, the polarity of access of the memory cell that is being programmed can be used to adjust the current magnitude and duration (I4, T4) accordingly. In a specific example, an increased current magnitude (I4) and an increased duration (T4) can be selected for a programming pulse when the polarity of access for the memory cell is negative (i.e., a negative polarity deck) as compared to when the polarity of access for the memory cell is positive (i.e., a positive polarity deck).

In one example, with respect to the polarity of access/polarity deck, a memory device can have two polarity of access. A positive polarity can correspond to an electrical connection where the current flows from the PM to the SD inside the cell stack. A negative polarity can correspond to an electrical connection where the current flows from the SD to the PM. In a 2-deck configuration sharing the same bitline with a positive voltage supply, the lower deck can have a positive access of polarity and the upper deck can have a negative access of polarity.

In one example, generally speaking, a solid state device (SSD) can distribute a write cycle relatively evenly across memory cells in an entire array, such that the memory cells have a relatively same write cycle count. The distribution of the write cycles can be maintained by a controller in the SSD. For example, the controller can maintain a counter to track the number of write cycles for the memory cells. The number of write cycles can be an input parameter when selecting the current magnitude (I4) for a programming pulse when programming a particular memory cell. In other words, depending on the number of write cycles, the current magnitude (I4) can be adjusted accordingly. In a specific example, a reduced current magnitude (I4) or an increased current magnitude (I4) can be selected depending on the number of write cycles for the memory cell. In other words, the current magnitude (I4) can be adjusted as a function of the number of write cycles for the memory cell.

In one example, generally speaking, for a two-dimensional array of memory cells, electrical voltages can be applied to write to a memory cell using wires that connect to the memory cell. The array can include a decoder that is connected via a metal line. The electrical power that is provided from the decoder over the metal line can depend on a distance (e.g., a relatively near or far distance) from a voltage source. In the two-dimensional array, there can be some memory cells that are located closer to the decoder, which can serve as a power source, while there can be some memory cells that are located farther from the decoder. A memory cell that is located further away from the decoder can receive a reduced bias due to resistance in the metal line. In other words, when delivering current to a far memory cell, an expected current may not be delivered to the far memory cell due to the resistance in the metal line. The far memory cell can experience increased resistance and increased current leakage. A memory cell that is located relatively close to the decoder can behave differently than a memory cell that is located relatively far from the decoder. Thus, using a current pulse with a common magnitude and/or duration may not be favorable for all memory cells in the two-dimensional array, as each memory cell can be a different distance from the decoder in the array. Therefore, as previously explained, a specific decoder distance of a memory cell that is being programmed can be accounted for when selecting the current magnitude (I4) during the programming set procedure. In other words, the distance between the decoder and the memory cell that is being programmed can be used to adjust the current magnitude (I4) accordingly. In a specific example, the current magnitude (I4) can be reduced for a far electrical distance from the decoder in the array, or the current magnitude (I4) can be increased for a near electrical distance from the decoder in the array.

FIG. 1A illustrates an example of a multi-stage programming set procedure for a memory stack that includes a SD and PM. During a first stage of the multi-stage programming set procedure, a first programming pulse having a first current magnitude and a first duration (I1, T1) can be applied. During a second stage of the multi-stage programming set procedure, a second programming pulse having a second current magnitude and a second duration (I2, T2) can be applied. During a third stage of the multi-stage programming set procedure, a third programming pulse having a third current magnitude and a third duration (I3, T3) can be applied. During a fourth stage of the multi-stage programming set procedure, a fourth programming pulse having a fourth current magnitude and a fourth duration (I4, T4) can be applied. During the fourth stage, the fourth current magnitude and the fourth duration (I4, T4) can be fixed for all bits. In other words, in the traditional multi-stage programming set procedure, the fourth current magnitude and the fourth duration (I4, T4) are fixed and are not adjusted based on a polarity of access, a number of prior write cycles and decoder distance.

Figure 1B:
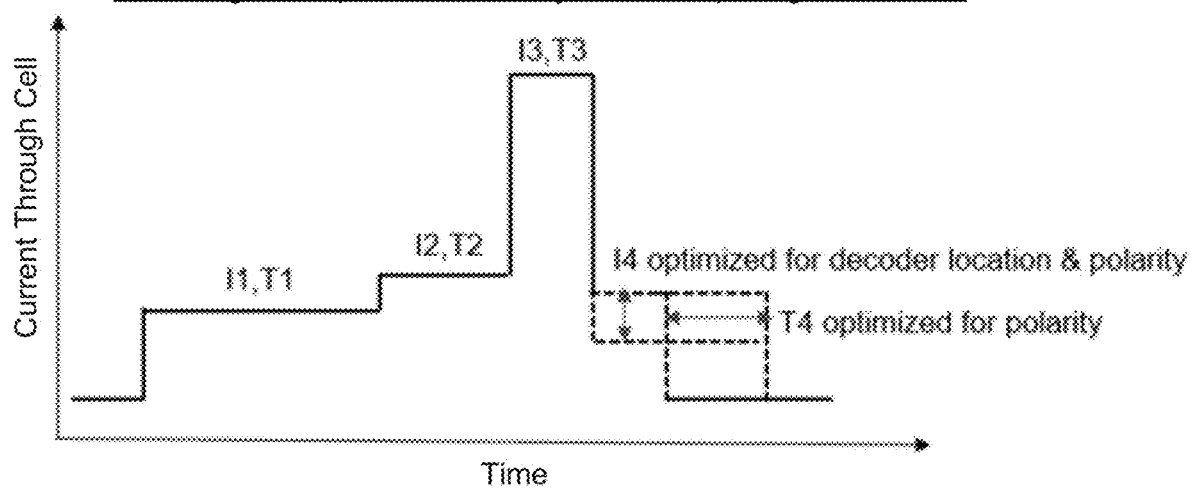
FIG. 1B illustrates a novel multi-stage programming set procedure for a memory stack that includes a select device (SD) and programmable memory (PM) in accordance with an example embodiment.

FIG. 1B illustrates an example embodiment of a multi-stage programming set procedure for a memory stack that includes a SD and PM. During a first stage of the multi-stage programming set procedure, a first programming pulse having a first current magnitude and a first duration (I1, T1) can be applied. During a second stage of the multi-stage programming set procedure, a second programming pulse having a second current magnitude and a second duration (I2, T2) can be applied. During a third stage of the multi-stage programming set procedure, a third programming pulse having a third current magnitude and a third duration (I3, T3) can be applied. During a fourth stage of the multi-stage programming set procedure, a fourth programming pulse having an adjustable fourth current magnitude and an adjustable fourth duration (I4, T4) can be applied. During the fourth stage, the fourth current magnitude and the fourth duration (I4, T4) can be adjustable and can be optimized based on a polarity of access, a number of prior write cycles and decoder distance. For example, the fourth current magnitude (I4) can be adjusted and optimized based on the polarity of access, the number of prior write cycles and the decoder distance, and the fourth duration (T4) can be adjusted and optimized based on the polarity of access. Therefore, in the novel multi-stage programming set procedure, the fourth current magnitude and the fourth duration (I4, T4) are not fixed, but rather are adjustable based on the polarity of access, the number of prior write cycles and the decoder distance.

Figure 2A:
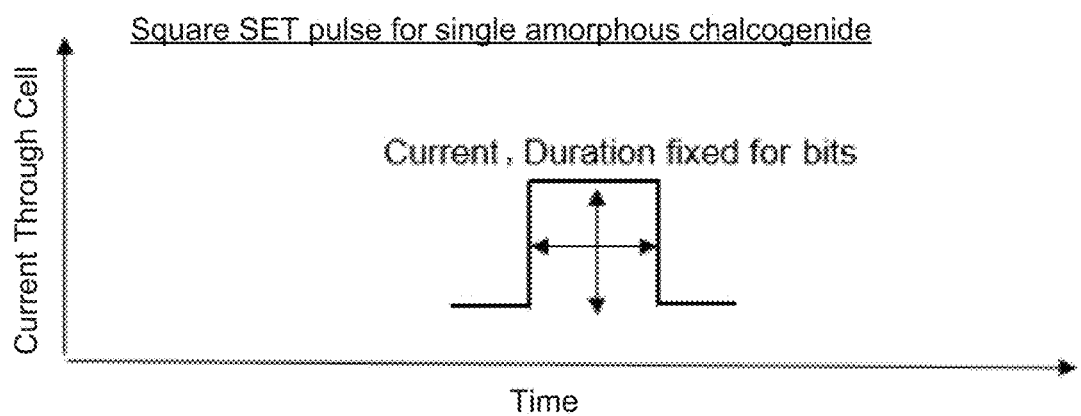
FIG. 2A illustrates a traditional square programming set pulse for single amorphous chalcogenide memory in accordance with an example embodiment.

FIG. 2A illustrates an example of a square programming set pulse for single amorphous chalcogenide memory. The square programming set pulse can have a fixed current magnitude (I) and a fixed duration (T) for all bits. In other words, for the traditional square programming set pulse, the current magnitude and the duration (I, T) are fixed and are not adjusted based on a polarity of access, a number of prior write cycles and decoder distance.

Figure 2B:
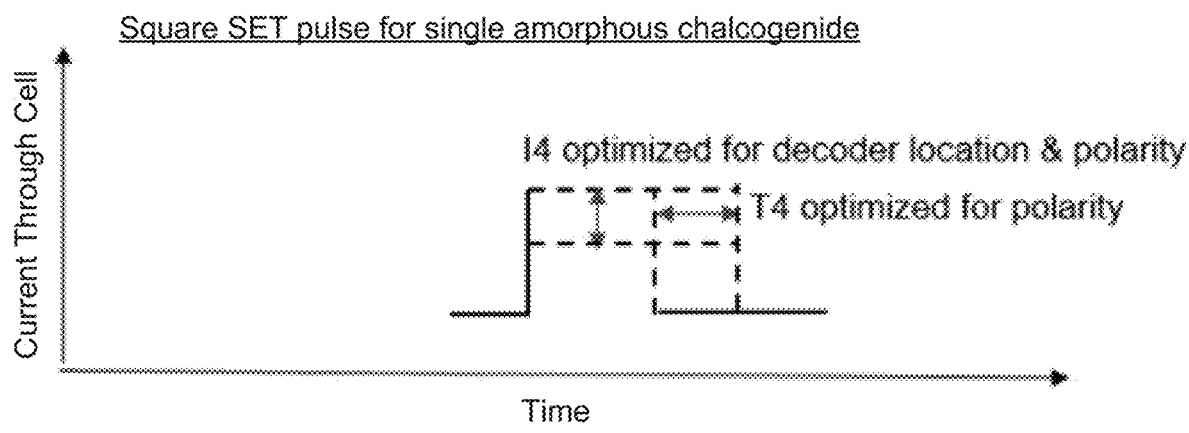
FIG. 2B illustrates a novel square programming set pulse for single amorphous chalcogenide memory in accordance with an example embodiment.

FIG. 2B illustrates an example embodiment of a square programming set pulse for single amorphous chalcogenide memory. During the square programming set pulse, an adjustable current magnitude (I) and an adjustable duration (T) can be applied. For example, the current magnitude and the duration (I, T) can be adjustable and can be optimized based on a polarity of access, a number of prior write cycles and decoder distance. For example, the current magnitude (I) can be adjusted and optimized based on the polarity of access, the number of prior write cycles and the decoder distance, and the duration (T) can be adjusted and optimized based on the polarity of access. Therefore, in the novel square programming set pulse, the current magnitude and the duration (I, T) are not fixed, but rather are adjustable based on the polarity of access, the number of prior write cycles and the decoder distance.

Figure 3:
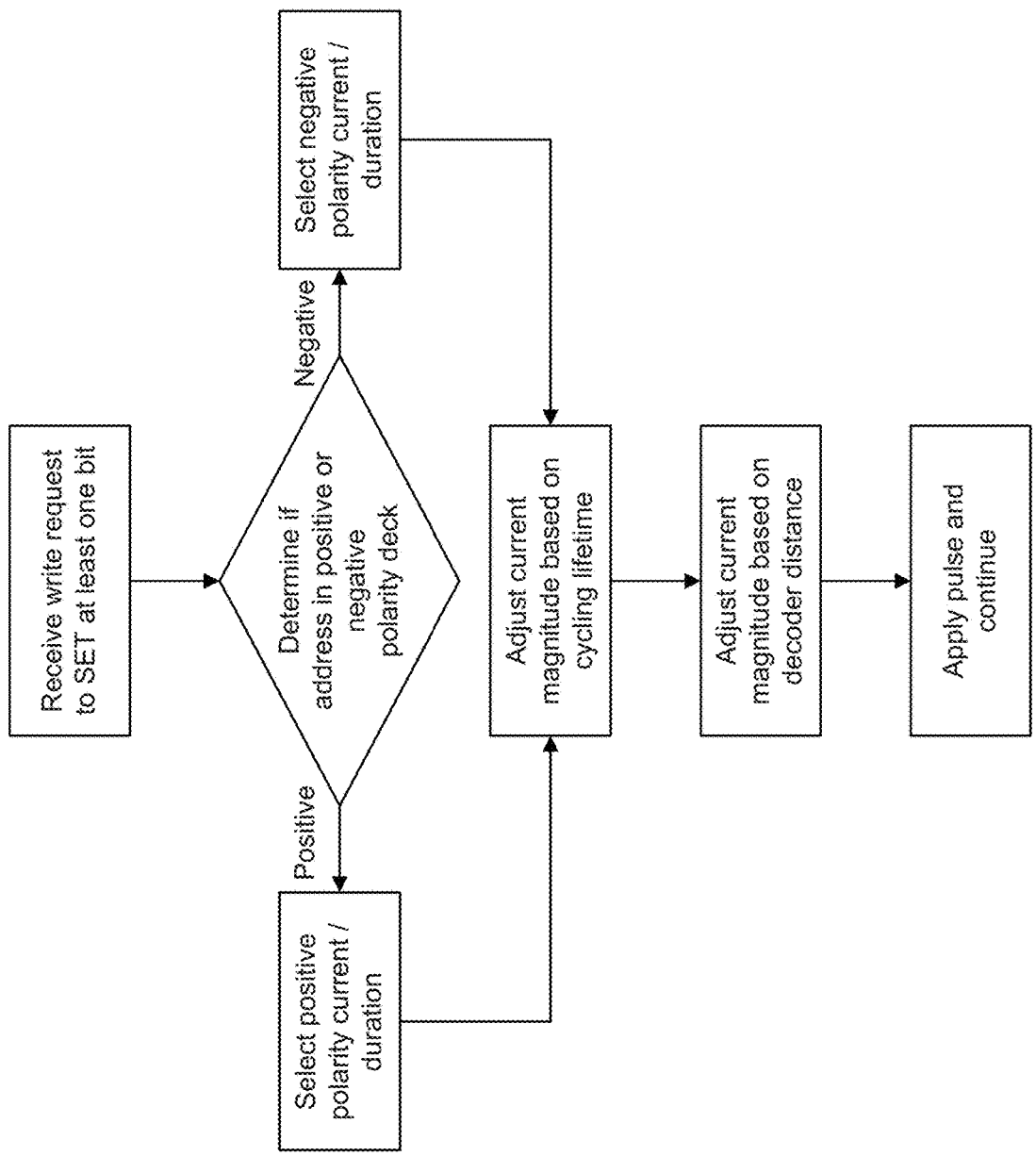
FIG. 3 is a flowchart illustrating a technique for applying a programming pulse based on a polarity of access for a memory cell, a number of prior write cycles for the memory cell, and decoder distance for the memory cell in accordance with an example embodiment.

FIG. 3 is an exemplary flowchart illustrating a technique for applying a programming pulse based on a polarity of access for a memory cell, a number of prior write cycles for the memory cell, and decoder distance for the memory cell. A program request (or write request) to program or set at least one memory cell (or bit) can be received. A determination can be made if a memory address associated with the memory cell to be programmed is in a positive polarity deck or a negative polarity deck. When the memory address is in the positive polarity deck, a positive polarity current/duration (I4/T4) can be selected. Alternatively, when the memory address is in the negative polarity deck, a negative polarity current/duration (I4/T4) can be selected. In other words, depending on the memory address, the memory cell can be known to be from an upper deck or a lower deck, and a corresponding polarity (i.e., negative or positive) can be determined. Then a current magnitude (I4) can be adjusted based on a cycling lifetime of the memory cell to be programmed. Then a current magnitude (I4) can be adjusted based on a decoder distance for the memory cell to be programmed. Thus, optimizations can be performed based on the deck/polarity, cycling lifetime and the decoder distance (in that specific order). After the current magnitude and duration (I4, T4) are selected accordingly, a programming pulse with an appropriate current magnitude and duration (I4, T4) can be applied for programming the memory cell.

Figure 4:
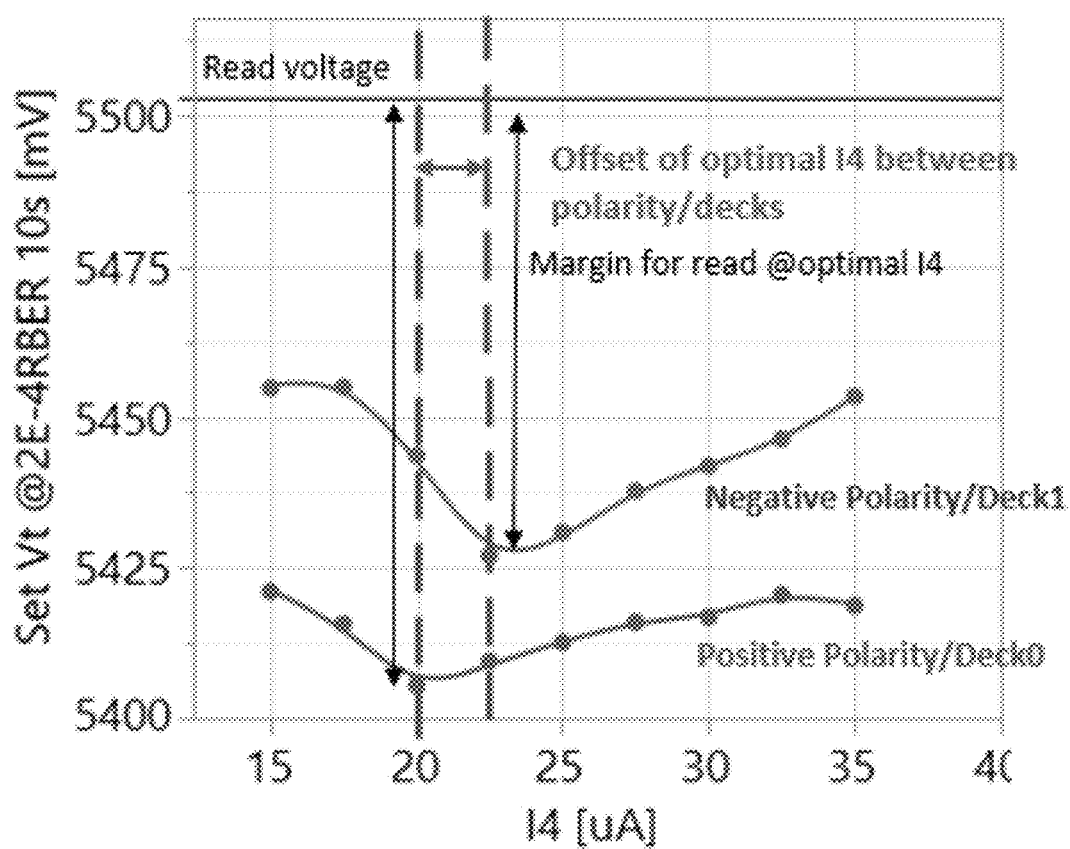
FIG. 4 illustrates a current magnitude of a programming set pulse depending on a polarity of access of a memory cell in accordance with an example embodiment.

FIG. 4 illustrates an exemplary current magnitude (I4) of a programming set pulse depending on a polarity of access of a memory cell. As shown, the current magnitude (I4), in micro amps (uA), can be in relation to a set voltage (Set Vt), in millivolts (mV). As shown, the set voltage can be at a desired bit error rate (BER) versus the current magnitude (I4), while showing a polarity/deck offset of an optimal current magnitude (I4) (i.e., offset of optimal I4 between polarity/decks). As shown, a read voltage can be applied and a margin for reading at an optimal I4 can be determined between polarity/decks. In one example, an increased current magnitude (I4) can be selected for the programming set pulse when the polarity of access for the memory cell is negative as compared to when the polarity of access for the memory cell is positive. As an example, the current magnitude (I4) can be increased by approximately 2.5 uA for a negative polarity access (i.e., negative polarity/deck 1) as compared to a positive polarity access (i.e., positive polarity/deck 0).

Figure 5:
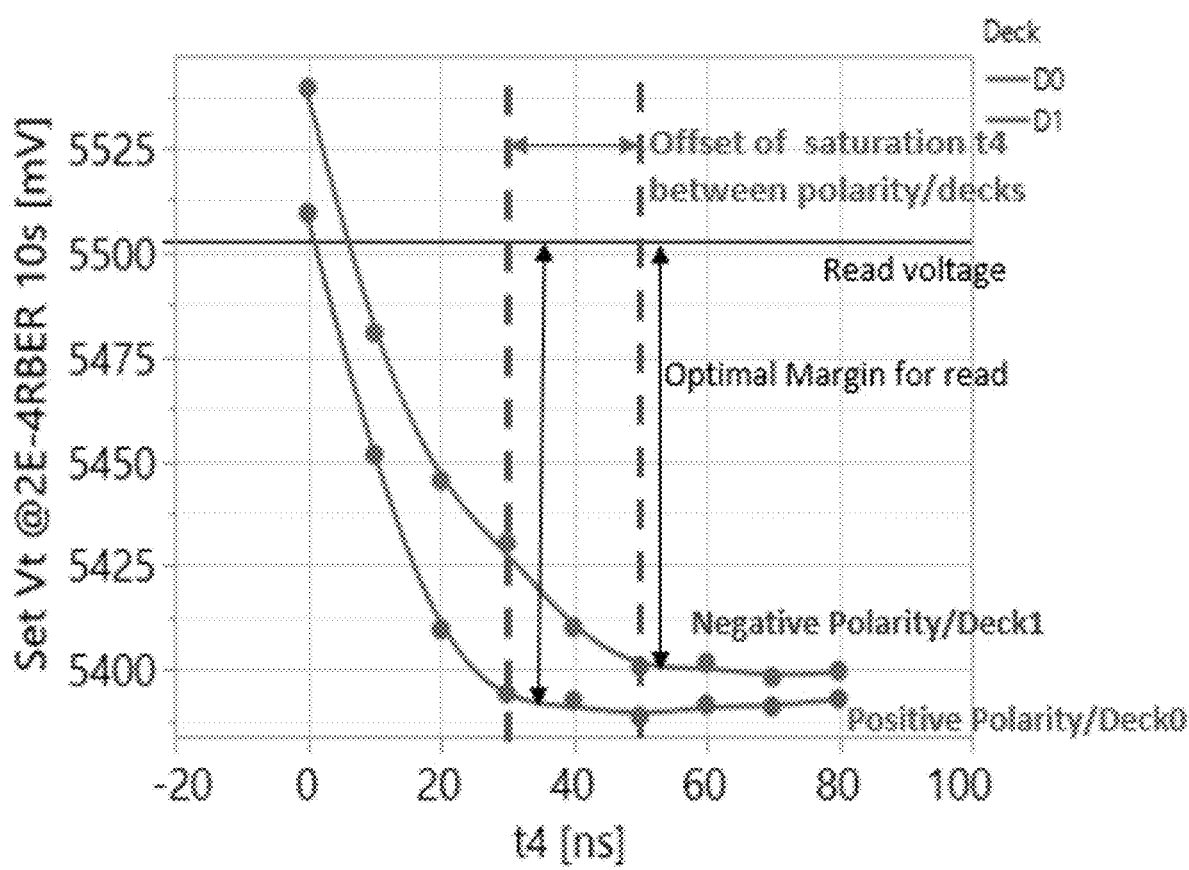
FIG. 5 illustrates a duration of a current magnitude of a programming set pulse depending on a polarity of access of a memory cell in accordance with an example embodiment.

FIG. 5 illustrates an exemplary duration (T4) of a programming set pulse depending on a polarity of access of a memory cell. As shown, the duration (T4), in nanoseconds (nS), can be in relation to a set voltage (Set Vt), in millivolts (mV). As shown, the set voltage can be at a desired bit error rate (BER) versus the duration (T4), while showing a polarity/deck offset of a saturation duration (T4) (i.e., offset of saturation T4 between polarity/decks). As shown, a read voltage can be applied and an optimal margin for the read can be determined between polarity/decks. In one example, an increased duration (T4) can be selected for the programming set pulse when the polarity of access for the memory cell is negative as compared to when the polarity of access for the memory cell is positive. As an example, the duration (T4) can be increased by approximately 20 ns for a negative polarity access (i.e., negative polarity/deck 1) as compared to a positive polarity access (i.e., positive polarity/deck 0).

Figure 6:
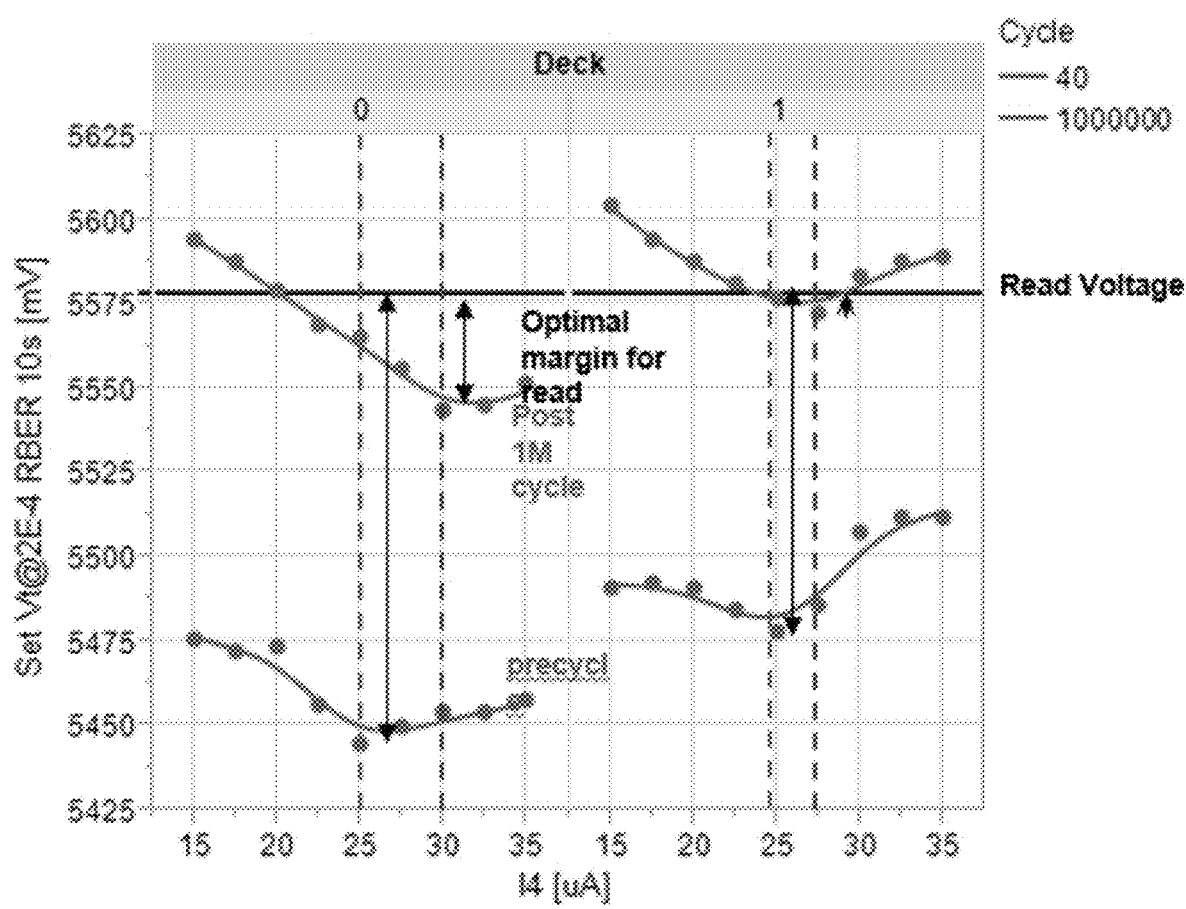
FIG. 6 illustrates a current magnitude of a programming set pulse depending on a number of prior write cycles for a memory cell in accordance with an example embodiment.

FIG. 6 illustrates an exemplary current magnitude (I4) of a programming set pulse depending on a number of prior write cycles for a memory cell. As shown, the current magnitude (I4), in micro amps (uA), can be in relation to a set voltage (Set Vt), in millivolts (mV). As shown, the set voltage can be at a desired bit error rate (BER) versus the current magnitude (I4), as a function of the deck/polarity and a number of prior write cycles (e.g., one million prior write cycles versus 40 prior write cycles). As shown, different current magnitude (I4) values can be selected depending on the number of prior write cycles (per deck/polarity). There can be a pre-cycle and a post cycle, and in some cases, the current magnitude (I4) can be increased for the post cycle. As shown, a read voltage can be applied and an optimal margin for the read can be determined depending on the number of prior write cycles and per polarity/deck. As an example, the current magnitude (I4) can be increased by approximately 2.5 uA or 5 uA for one million prior write cycles as opposed to 40 prior write cycles, depending on the deck/polarity.

In one example, the current magnitude (I4) can be an increased or a decreased amount as a function of the number of prior write cycles. For example, the current magnitude (I4) can be increased by 2.5 uA to 5 uA post one million write cycles. However, different process/cell architecture can utilize slightly different numbers. In addition, a negative shift may be possible in some situations.

Figure 7:
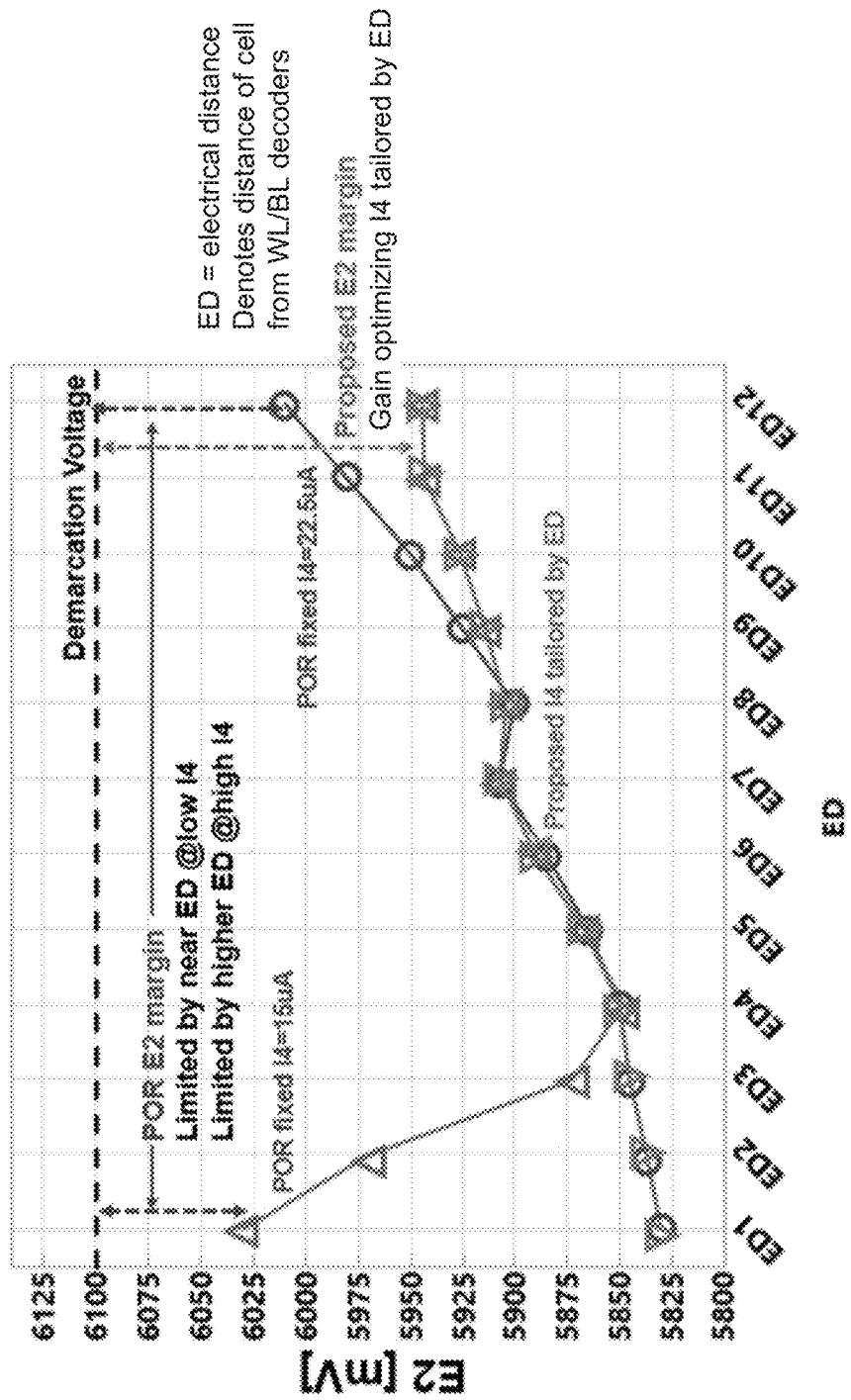
FIG. 7 illustrates a current magnitude of a programming set pulse depending on a decoder distance for a memory cell in accordance with an example embodiment.

FIG. 7 illustrates an exemplary current magnitude (I4) of a programming set pulse depending on a decoder distance for a memory cell. The decoder distance can be an electrical distance (ED) between a memory cell and wordline/bitline (WL/BL) decoders. As shown, in previous solutions, the current magnitude (I4) would be fixed. In contrast, in the present technology as shown, the current magnitude (I4) can be adjusted or tailored based on the decoder distance. For example, the current magnitude (I4) can be reduced for a far electrical distance from the decoders, and the current magnitude (I4) can be increased for a near electrical distance from the decoders. In addition, the ED (e.g., ED1 to ED12) can be shown in terms of an E2 margin, which represents a delta between a demarcation voltage and a memory cell Vt.

Figure 8:
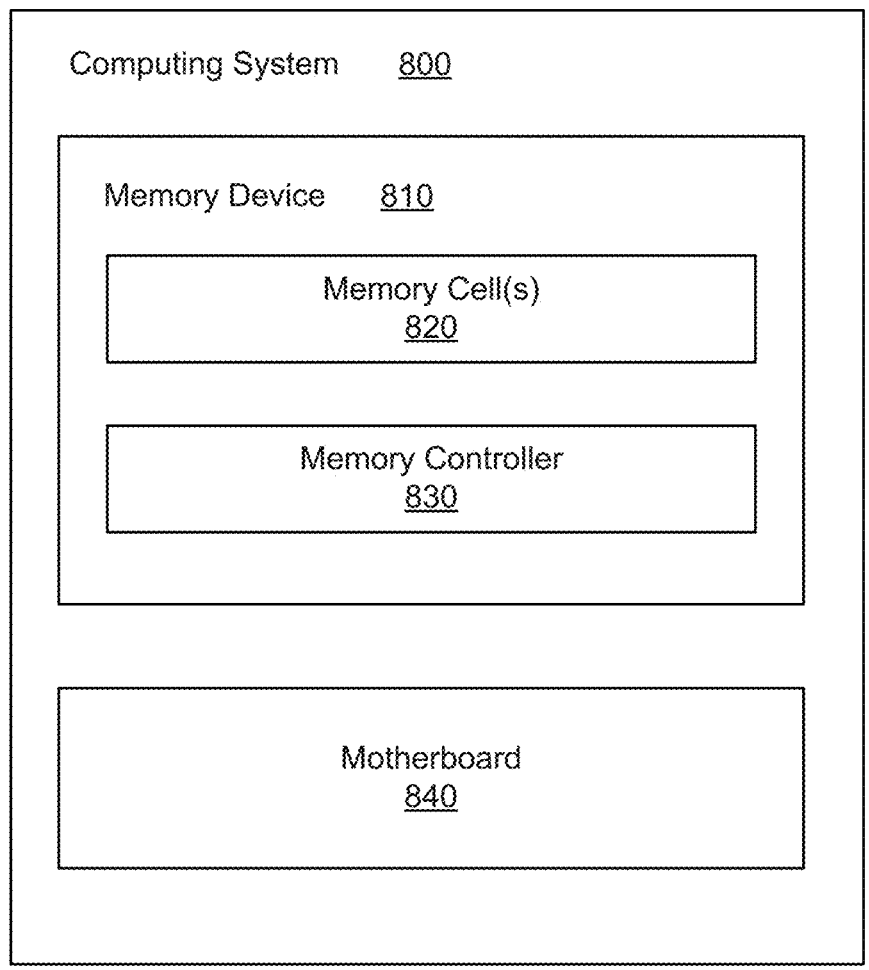
FIG. 8 illustrates a computing system that includes a memory device in accordance with an example embodiment.

FIG. 8 illustrates a computing system 800. The computing system 800 can include a memory device 810 and a motherboard 840. The memory device 810 can include memory cell(s) 820 and a memory controller 830. In one example, the memory cell(s) 820 can comprise phase change memory. In an alternative example, the memory cell(s) 820 can comprise single amorphous chalcogenide memory.

In one example, the memory controller 830 can receive a request to program a memory cell 820 within an array of memory cells 820. The memory controller 830 can select a current magnitude and a duration of the current magnitude for a programming set pulse based on a polarity of access for the memory cell 820, a number of prior write cycles for the memory cell 820, and electrical distances between the memory cell 820 and wordline/bitline decoders within the array of memory cells 820. The memory controller 830 can initiate, in response to the request, the programming set pulse to program the memory cell 820 within the array of memory cells 820, where the selected current magnitude and the selected duration of the current magnitude can be applied during the programming set pulse.

In one example, the programming set pulse can be a multi-stage programming set pulse. In an alternative example, the programming set pulse can be a square programming set pulse.

In one example, the memory controller 830 can select the current magnitude and the duration of the current magnitude for a termination stage of a multi-stage programming set pulse based on the polarity of access, the number of prior write cycles, and the electrical distances, where the selected current magnitude and the selected duration of the current magnitude can be applied during the termination stage of the multi-stage programming set pulse.

In one example, the memory controller 830 can select the current magnitude and the duration of the current magnitude for a square programming set pulse based on the polarity of access, the number of prior write cycles, and the electrical distances, where the selected current magnitude and the selected duration of the current magnitude can be applied during the square programming set pulse.

In one example, the memory controller 830 can determine the polarity of access for the memory cell 820 to be positive when a memory address of the memory cell 820 is associated with a positive polarity deck. The memory controller 830 can determine the polarity of access for the memory cell 820 to be negative when the memory address of the memory cell 820 is associated with a negative polarity deck. The memory controller 830 can select the current magnitude and the duration of the current magnitude during the programming set pulse in accordance with the polarity of access being positive or the polarity of access being negative.

In one example, the memory controller 830 can select an increased current magnitude and an increased duration of the current magnitude for the programming set pulse when the polarity of access for the memory cell 820 is negative as compared to when the polarity of access for the memory cell 820 is positive.

In one example, the memory controller 830 can determine the number of prior write cycles for the memory cell 820. The memory controller 830 can select an increased current magnitude or a decreased current magnitude for the programming set pulse depending on the number of prior write cycles for the memory cell 820.

In one example, the memory controller 830 can determine the electrical distances between the memory cell 820 and the wordline/bitline decoders within the array of memory cells 820. The memory controller 830 can select the current magnitude for the programming set pulse in accordance with the electrical distances between the memory cell 820 and the wordline/bitline decoders being less than a defined threshold or greater than a defined threshold.

In one example, the memory controller 830 can select a decreased current magnitude for the programming set pulse when the electrical distances between the memory cell 820 and the wordline/bitline decoders are greater than the defined threshold, indicating that the memory cell 820 is located relatively far from the wordline/bitline decoders. The memory controller 830 can select an increased current magnitude for the programming set pulse when the electrical distances between the memory cell 820 and the wordline/bitline decoders are less than the defined threshold, indicating that the memory cell 820 is located relatively near the wordline/bitline decoders.

In one example, the memory controller 830 can initiate the programming set pulse for a memory stack that comprises programmable memory (PM) and a selecting device (SD).

In one example, the current magnitude and the duration of the current magnitude for the programming set pulse can be variable depending on the polarity of access for the memory cell 820, the number of prior write cycles for the memory cell 820, and the electrical distances between the memory cell 820 and wordline/bitline decoders within the array of memory cells 820.

Figure 9:
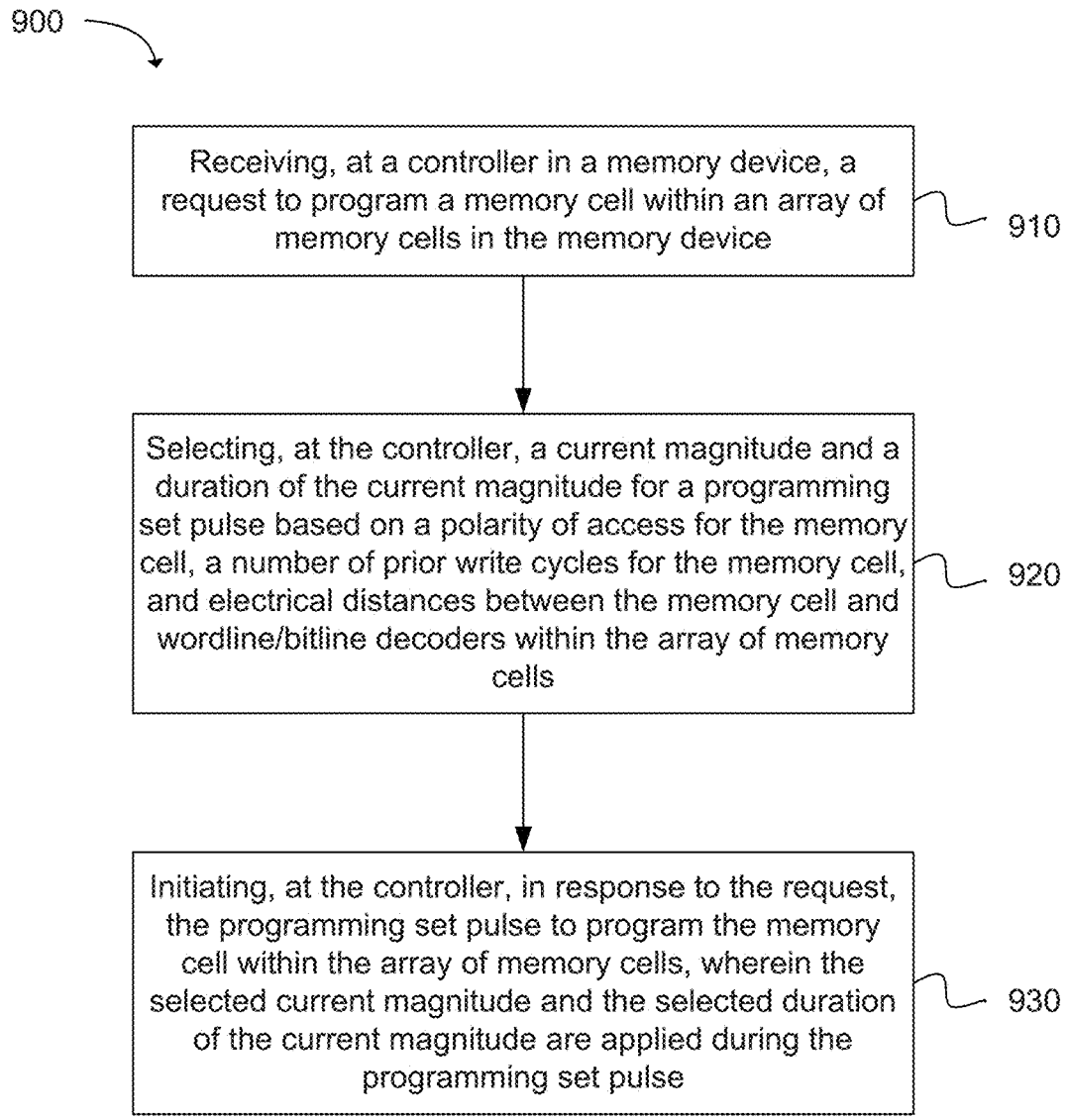
FIG. 9 is a flowchart illustrating operations for initiating a programming set pulse to program a memory cell in accordance with an example embodiment.

Another example provides a method 900 for initiating a programming set pulse to program a memory cell, as shown in the flow chart in FIG. 9. The method can be executed as instructions on a machine, where the instructions are included on at least one computer readable medium or one non-transitory machine readable storage medium. The method can include the operation of receiving, at a controller in a memory device, a request to program a memory cell within an array of memory cells in the memory device, as in block 910. The method can include the operation of: selecting, at the controller, a current magnitude and a duration of the current magnitude for a programming set pulse based on a polarity of access for the memory cell, a number of prior write cycles for the memory cell, and electrical distances between the memory cell and wordline/bitline decoders within the array of memory cells, as in block 920. The method can include the operation of: initiating, at the controller, in response to the request, the programming set pulse to program the memory cell within the array of memory cells, wherein the selected current magnitude and the selected duration of the current magnitude are applied during the programming set pulse, as in block 930.

Figure 10:
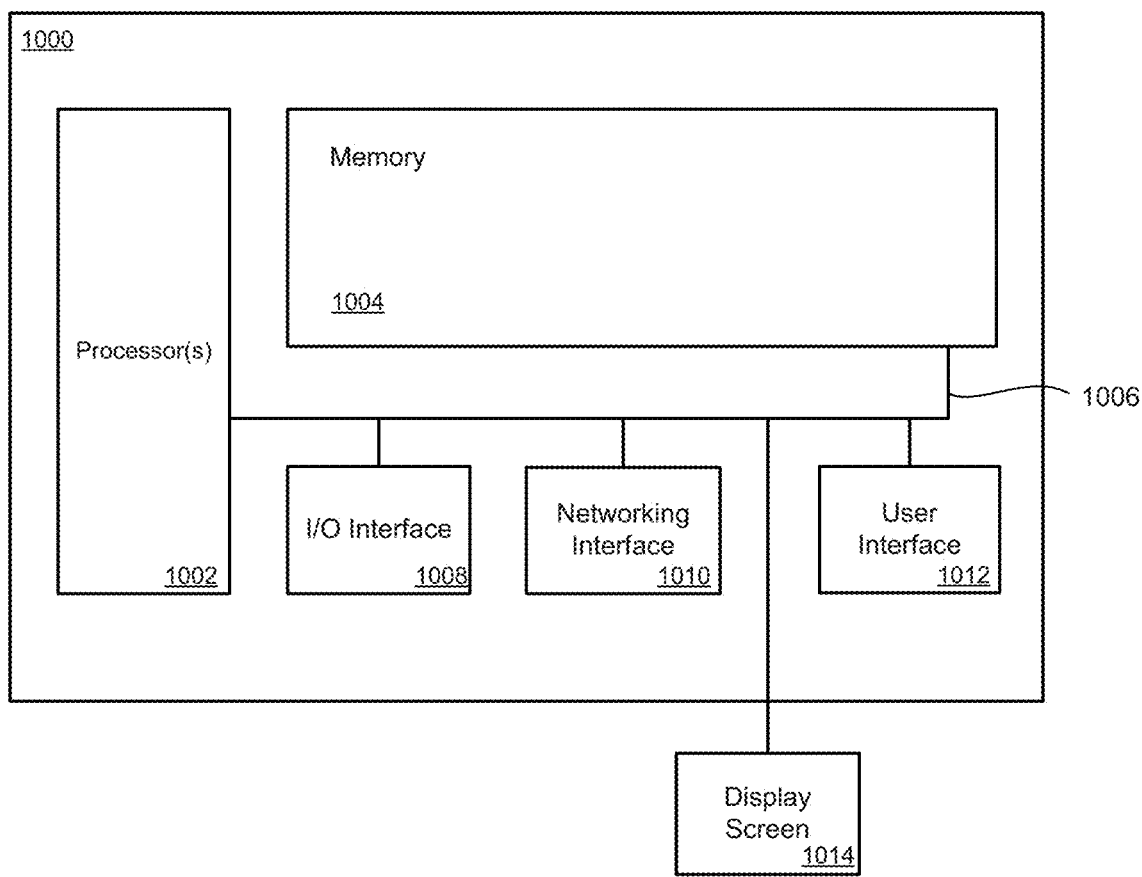
FIG. 10 illustrates a computing system that includes a data storage device in accordance with an example embodiment.

FIG. 10 illustrates a general computing system or device 1000 that can be employed in the present technology. The computing system 1000 can include a processor 1002 in communication with a memory 1004. The memory 1004 can include any device, combination of devices, circuitry, and the like that is capable of storing, accessing, organizing, and/or retrieving data. Non-limiting examples include SANs (Storage Area Network), cloud storage networks, volatile or non-volatile RAM, phase change memory, optical media, hard-drive type media, and the like, including combinations thereof.

The computing system or device 1000 additionally includes a local communication interface 1006 for connectivity between the various components of the system. For example, the local communication interface 1006 can be a local data bus and/or any related address or control busses as may be desired.

The computing system or device 1000 can also include an I/O (input/output) interface 1008 for controlling the I/O functions of the system, as well as for I/O connectivity to devices outside of the computing system 1000. A network interface 1010 can also be included for network connectivity. The network interface 1010 can control network communications both within the system and outside of the system. The network interface can include a wired interface, a wireless interface, a Bluetooth interface, optical interface, and the like, including appropriate combinations thereof. Furthermore, the computing system 1000 can additionally include a user interface 1012, a display device 1014, as well as various other components that would be beneficial for such a system.

The processor 1002 can be a single or multiple processors, and the memory 1004 can be a single or multiple memories. The local communication interface 1006 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific technology embodiments and point out specific features, elements, or steps that can be used or otherwise combined in achieving such embodiments.

In one example, there is provided a memory device. The memory device can comprise an array of memory cells and a memory controller. The memory controller can comprise logic to receive a request to program a memory cell within the array of memory cells. The memory controller can comprise logic to select a current magnitude and a duration of the current magnitude for a programming set pulse based on a polarity of access for the memory cell, a number of prior write cycles for the memory cell, and electrical distances between the memory cell and wordline/bitline decoders within the array of memory cells. The memory controller can comprise logic to initiate, in response to the request, the programming set pulse to program the memory cell within the array of memory cells, wherein the selected current magnitude and the selected duration of the current magnitude are applied during the programming set pulse.

In one example of the memory device, the memory controller further comprises logic to: select the current magnitude and the duration of the current magnitude for a termination stage of a multi-stage programming set pulse based on the polarity of access, the number of prior write cycles, and the electrical distances, wherein the selected current magnitude and the selected duration of the current magnitude are applied during the termination stage of the multi-stage programming set pulse.

In one example of the memory device, the memory controller further comprises logic to: select the current magnitude and the duration of the current magnitude for a square programming set pulse based on the polarity of access, the number of prior write cycles, and the electrical distances, wherein the selected current magnitude and the selected duration of the current magnitude are applied during the square programming set pulse.

In one example of the memory device, the memory controller further comprises logic to determine the polarity of access for the memory cell to be positive when a memory address of the memory cell is associated with a positive polarity deck. The memory controller further comprises logic to determine the polarity of access for the memory cell to be negative when the memory address of the memory cell is associated with a negative polarity deck. The memory controller further comprises logic to select the current magnitude and the duration of the current magnitude during the programming set pulse in accordance with the polarity of access being positive or the polarity of access being negative.

In one example of the memory device, the memory controller further comprises logic to select an increased current magnitude and an increased duration of the current magnitude for the programming set pulse when the polarity of access for the memory cell is negative as compared to when the polarity of access for the memory cell is positive.

In one example of the memory device, the memory controller further comprises logic to determine the number of prior write cycles for the memory cell. The memory controller further comprises logic to select an increased current magnitude or a decreased current magnitude for the programming set pulse depending on the number of prior write cycles for the memory cell.

In one example of the memory device, the memory controller further comprises logic to determine the electrical distances between the memory cell and the wordline/bitline decoders within the array of memory cells. The memory controller further comprises logic to select the current magnitude for the programming set pulse in accordance with the electrical distances between the memory cell and the wordline/bitline decoders being less than a defined threshold or greater than a defined threshold.

In one example of the memory device, the memory controller further comprises logic to select a decreased current magnitude for the programming set pulse when the electrical distances between the memory cell and the wordline/bitline decoders are greater than the defined threshold, indicating that the memory cell is located relatively far from the wordline/bitline decoders. Alternatively, the memory controller further comprises logic to select an increased current magnitude for the programming set pulse when the electrical distances between the memory cell and the wordline/bitline decoders are less than the defined threshold, indicating that the memory cell is located relatively near the wordline/bitline decoders.

In one example of the memory device, the memory controller further comprises logic to initiate the programming set pulse for a memory stack that comprises a programmable memory element (PM) and a selecting device (SD).

In one example of the memory device, the current magnitude and the duration of the current magnitude for the programming set pulse are variable depending on the polarity of access for the memory cell, the number of prior write cycles for the memory cell, and the electrical distances between the memory cell and wordline/bitline decoders within the array of memory cells.

In one example of the memory device, the programming set pulse is a multi-stage programming set pulse.

In one example of the memory device, the programming set pulse is a square programming set pulse.

In one example of the memory device, the array of memory cells comprises phase change memory.

In one example of the memory device, wherein the array of memory cells comprises single amorphous chalcogenide memory.

In one example, there is provided a computing system. The computing system can include a motherboard and a memory device coupled to the motherboard.

In one example of the computing system, the computing system comprises a desktop computer, a laptop, a tablet, a smartphone, a wearable device, a server, or a combination thereof.

In one example of the computing system, the computing system further comprises a processor, a heat sink, a radio, a slot, a port, or a combination thereof operably coupled to the motherboard.

In one example, there is provided a controller configured to initiate a programming set pulse to program a memory cell. The controller can comprise logic to receive a request to program a memory cell within an array of memory cells in a memory device. The controller can comprise logic to select a current magnitude and a duration of the current magnitude for a programming set pulse based on a polarity of access for the memory cell, a number of prior write cycles for the memory cell, and electrical distances between the memory cell and wordline/bitline decoders within the array of memory cells. The controller can comprise logic to initiate, in response to the request, the programming set pulse to program the memory cell within the array of memory cells, wherein the selected current magnitude and the selected duration of the current magnitude are applied during the programming set pulse.

In one example of the controller, the controller can comprise logic to select the current magnitude and the duration of the current magnitude for a termination stage of a multi-stage programming set pulse based on the polarity of access, the number of prior write cycles, and the electrical distances, wherein the selected current magnitude and the selected duration of the current magnitude are applied during the termination stage of the multi-stage programming set pulse.

In one example of the controller, the controller can comprise logic to select the current magnitude and the duration of the current magnitude for a square programming set pulse based on the polarity of access, the number of prior write cycles, and the electrical distances, wherein the selected current magnitude and the selected duration of the current magnitude are applied during the square programming set pulse.

In one example of the controller, the controller can comprise logic to determine the polarity of access for the memory cell to be positive when a memory address of the memory cell is associated with a positive polarity deck. The controller can comprise logic to determine the polarity of access for the memory cell to be negative when the memory address of the memory cell is associated with a negative polarity deck. The controller can comprise logic to select the current magnitude and the duration of the current magnitude during the programming set pulse in accordance with the polarity of access being positive or the polarity of access being negative.

In one example of the controller, the controller can comprise logic to select an increased current magnitude and an increased duration of the current magnitude for the programming set pulse when the polarity of access for the memory cell is negative as compared to when the polarity of access for the memory cell is positive.

In one example of the controller, the controller can comprise logic to determine the number of prior write cycles for the memory cell. The controller can comprise logic to select an increased current magnitude or a decreased current magnitude for the programming set pulse depending on the number of prior write cycles for the memory cell.

In one example of the controller, the controller can comprise logic to determine the electrical distances between the memory cell and the wordline/bitline decoders within the array of memory cells. The controller can comprise logic to select the current magnitude for the programming set pulse in accordance with the electrical distances between the memory cell and the wordline/bitline decoders being less than a defined threshold or greater than a defined threshold.

In one example of the controller, the controller can comprise logic to select a decreased current magnitude for the programming set pulse when the electrical distances between the memory cell and the wordline/bitline decoders are greater than the defined threshold, indicating that the memory cell is located relatively far from the wordline/bitline decoders. Alternatively, the controller can comprise logic to select an increased current magnitude for the programming set pulse when the electrical distances between the memory cell and the wordline/bitline decoders are less than the defined threshold, indicating that the memory cell is located relatively near the wordline/bitline decoders.

In one example of the controller, the programming set pulse is a multi-stage programming set pulse.

In one example of the controller, the programming set pulse is a square programming set pulse.

In one example of the controller, the array of memory cells comprises phase change memory.

In one example of the controller, the array of memory cells comprises single amorphous chalcogenide memory.

In one example, there is provided a method for initiating a programming set pulse to program a memory cell. The method can include the operation of: receiving, at a controller in a memory device, a request to program a memory cell within an array of memory cells in the memory device. The method can include the operation of: selecting, at the controller, a current magnitude and a duration of the current magnitude for a programming set pulse based on a polarity of access for the memory cell, a number of prior write cycles for the memory cell, and electrical distances between the memory cell and wordline/bitline decoders within the array of memory cells. The method can include the operation of: initiating, at the controller, in response to the request, the programming set pulse to program the memory cell within the array of memory cells, wherein the selected current magnitude and the selected duration of the current magnitude are applied during the programming set pulse.

In one example of the method for initiating the programming set pulse to program the memory cell, the method further comprises the operation of: selecting the current magnitude and the duration of the current magnitude for a termination stage of a multi-stage programming set pulse based on the polarity of access, the number of prior write cycles, and the electrical distances, wherein the selected current magnitude and the selected duration of the current magnitude are applied during the termination stage of the multi-stage programming set pulse.

In one example of the method for initiating the programming set pulse to program the memory cell, the method further comprises the operation of: selecting the current magnitude and the duration of the current magnitude for a square programming set pulse based on the polarity of access, the number of prior write cycles, and the electrical distances, wherein the selected current magnitude and the selected duration of the current magnitude are applied during the square programming set pulse.

In one example of the method for initiating the programming set pulse to program the memory cell, the method further comprises the operations of: determining the polarity of access for the memory cell to be positive when a memory address of the memory cell is associated with a positive polarity deck; determining the polarity of access for the memory cell to be negative when the memory address of the memory cell is associated with a negative polarity deck; and selecting the current magnitude and the duration of the current magnitude during the programming set pulse in accordance with the polarity of access being positive or the polarity of access being negative.

In one example of the method for initiating the programming set pulse to program the memory cell, the method further comprises the operation of: selecting an increased current magnitude and an increased duration of the current magnitude for the programming set pulse when the polarity of access for the memory cell is negative as compared to when the polarity of access for the memory cell is positive.

In one example of the method for initiating the programming set pulse to program the memory cell, the method further comprises the operations of: determining the number of prior write cycles for the memory cell; and selecting an increased current magnitude or a decreased current magnitude for the programming set pulse depending on the number of prior write cycles for the memory cell.

In one example of the method for initiating the programming set pulse to program the memory cell, the method further comprises the operations of: determining the electrical distances between the memory cell and the wordline/bitline decoders within the array of memory cells; and selecting the current magnitude for the programming set pulse in accordance with the electrical distances between the memory cell and the wordline/bitline decoders being less than a defined threshold or greater than a defined threshold.

In one example of the method for initiating the programming set pulse to program the memory cell, the method further comprises the operation of: selecting a decreased current magnitude for the programming set pulse when the electrical distances between the memory cell and the wordline/bitline decoders are greater than the defined threshold, indicating that the memory cell is located relatively far from the wordline/bitline decoders; or selecting an increased current magnitude for the programming set pulse when the electrical distances between the memory cell and the wordline/bitline decoders are less than the defined threshold, indicating that the memory cell is located relatively near the wordline/bitline decoders.

In one example of the method for initiating the programming set pulse to program the memory cell, the programming set pulse is a multi-stage programming set pulse.

In one example of the method for initiating the programming set pulse to program the memory cell, the programming set pulse is a square programming set pulse.

In one example of the method for initiating the programming set pulse to program the memory cell, the array of memory cells comprises phase change memory.

In one example of the method for initiating the programming set pulse to program the memory cell, the array of memory cells comprises single amorphous chalcogenide memory.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device, comprising:
   an array of memory cells; and
   a memory controller comprising logic to:
   receive a request to program a memory cell within the array of memory cells;
   select a current magnitude and duration for a programming set pulse based on a polarity of access for the memory cell, a number of prior write cycles for the memory cell, or electrical distances between the memory cell and wordline/bitline decoders within the array of memory cells; and
   initiate the programming set pulse at the selected magnitude and duration.

2. The memory device of claim 1, wherein the memory controller further comprises logic to:
   select the current magnitude and the duration of the current magnitude for a termination stage of a multi-stage programming set pulse based on the polarity of access, the number of prior write cycles, or the electrical distances, and apply the selected current magnitude and the selected duration of the current magnitude during the termination stage of the multi-stage programming set pulse.

3. The memory device of claim 1, wherein the memory controller further comprises logic to:
   select the current magnitude and the duration of the current magnitude for a square programming set pulse based on the polarity of access, the number of prior write cycles, or the electrical distances, and apply the selected current magnitude and the selected duration of the current magnitude during the square programming set pulse.

4. The memory device of claim 1, wherein the memory controller further comprises logic to:
   determine the polarity of access for the memory cell to be positive when a memory address of the memory cell is associated with a positive polarity deck;
   determine the polarity of access for the memory cell to be negative when the memory address of the memory cell is associated with a negative polarity deck; and
   select the current magnitude and the duration of the current magnitude to be applied during the programming set pulse in accordance with the polarity of access being positive or the polarity of access being negative.

5. The memory device of claim 4, wherein the memory controller further comprises logic to select an increased current magnitude and an increased duration of the current magnitude for the programming set pulse when the polarity of access for the memory cell is negative as compared to when the polarity of access for the memory cell is positive.

6. The memory device of claim 1, wherein the memory controller further comprises logic to:
   determine the number of prior write cycles for the memory cell; and
   select an increased current magnitude or a decreased current magnitude for the programming set pulse depending on the number of prior write cycles for the memory cell.

7. The memory device of claim 1, wherein the memory controller further comprises logic to:
   determine the electrical distances between the memory cell and the wordline/bitline decoders within the array of memory cells; and select the current magnitude for the programming set pulse in accordance with the electrical distances between the memory cell and the wordline/bitline decoders being less than a defined threshold or greater than a defined threshold.

8. The memory device of claim 7, wherein the memory controller further comprises logic to:
select a decreased current magnitude for the programming set pulse when the electrical distances between the memory cell and the wordline/bitline decoders are greater than the defined threshold, indicating that the memory cell is located relatively far from the wordline/bitline decoders; or
select an increased current magnitude for the programming set pulse when the electrical distances between the memory cell and the wordline/bitline decoders are less than the defined threshold, indicating that the memory cell is located relatively near the wordline/bitline decoders.

9. The memory device of claim 1, wherein the memory controller further comprises logic to initiate the programming set pulse for a memory stack that comprises a programmable memory element (PM) and a selecting device (SD).

10. The memory device of claim 1, wherein the current magnitude and the duration of the current magnitude for the a programming set pulse are variable depending on the polarity of access for the memory cell, the number of prior write cycles for the memory cell, and the electrical distances between the memory cell and wordline/bitline decoders within the array of memory cells.

11. The memory device of claim 1, wherein the programming set pulse is a multi-stage programming set pulse.

12. The memory device of claim 1, wherein the programming set pulse is a square programming set pulse.

13. The memory device of claim 1, wherein the array of memory cells comprises phase change memory.

14. The memory device of claim 1, wherein the array of memory cells comprises single amorphous chalcogenide memory.

15. A method for initiating a programming set pulse to program a memory cell, the method comprising:
receiving, at a controller in a memory device, a request to program a memory cell within an array of memory cells in the memory device;
selecting, at the controller, a current magnitude and a duration of the current magnitude for a programming set pulse based on a polarity of access for the memory cell, a number of prior write cycles for the memory cell, or electrical distances between the memory cell and wordline/bitline decoders within the array of memory cells; and
initiating, at the controller, the programming set pulse to program the memory cell within the array of memory cells.

16. The method of claim 15, further comprising:
selecting the current magnitude and the duration of the current magnitude for a termination stage of a multi-stage programming set pulse based on the polarity of access, the number of prior write cycles, or the electrical distances, and applying the selected current magnitude and the selected duration of the current magnitude during the termination stage of the multi-stage programming set pulse.

17. The method of claim 15, further comprising:
selecting the current magnitude and the duration of the current magnitude for a square programming set pulse based on the polarity of access, the number of prior write cycles, or the electrical distances, and applying the selected current magnitude and the selected duration of the current magnitude during the square programming set pulse.

18. The method of claim 15, further comprising:
determining the polarity of access for the memory cell to be positive when a memory address of the memory cell is associated with a positive polarity deck;
determining the polarity of access for the memory cell to be negative when the memory address of the memory cell is associated with a negative polarity deck; and
selecting the current magnitude and the duration of the current magnitude to be applied during the programming set pulse in accordance with the polarity of access being positive or the polarity of access being negative.

19. The method of claim 18, further comprising selecting an increased current magnitude and an increased duration of the current magnitude for the programming set pulse when the polarity of access for the memory cell is negative as compared to when the polarity of access for the memory cell is positive.

20. The method of claim 15, further comprising:
determining the number of prior write cycles for the memory cell; and
selecting an increased current magnitude or a decreased current magnitude for the programming set pulse depending on the number of prior write cycles for the memory cell.

21. The method of claim 15, further comprising:
determining the electrical distances between the memory cell and the wordline/bitline decoders within the array of memory cells; and
selecting the current magnitude for the programming set pulse in accordance with the electrical distances between the memory cell and the wordline/bitline decoders being less than a defined threshold or greater than a defined threshold.

22. The method of claim 21, further comprising:
selecting a decreased current magnitude for the programming set pulse when the electrical distances between the memory cell and the wordline/bitline decoders are greater than the defined threshold, indicating that the memory cell is located relatively far from the wordline/bitline decoders; or
selecting an increased current magnitude for the programming set pulse when the electrical distances between the memory cell and the wordline/bitline decoders are less than the defined threshold, indicating that the memory cell is located relatively near the wordline/bitline decoders.

23. The method of claim 15, wherein the programming set pulse is a multi-stage programming set pulse.

24. The method of claim 15, wherein the programming set pulse is a square programming set pulse.

25. The method of claim 15, wherein the array of memory cells comprises phase change memory.

26. The method of claim 15, wherein the array of memory cells comprises single amorphous chalcogenide memory.

* * * * *